(12) United States Patent
Kengeri et al.

(10) Patent No.: US 6,331,961 B1
(45) Date of Patent: Dec. 18, 2001

(54) DRAM BASED REFRESH-FREE TERNARY CAM

(75) Inventors: Subramani Kengeri, San Jose; Hemraj K. Hingarh, Saratoga, both of CA (US)

(73) Assignee: Silicon Access Networks, Inc., San Jose, CA (US)

( * ) Notice: Subject to any disclaimer, the term of this patent is extended or adjusted under 35 U.S.C. 154(b) by 0 days.

(21) Appl. No.: 09/591,033

(22) Filed: Jun. 9, 2000

(51) Int. Cl.[7] ..................................................... G11C 7/00
(52) U.S. Cl. .............................. 365/222; 365/49; 365/149
(58) Field of Search .............................. 365/49, 149, 222

(56) References Cited

U.S. PATENT DOCUMENTS 4,672,580 * 6/1987 Yau et al. .

* cited by examiner

Primary Examiner—Vu A. Le
(74) Attorney, Agent, or Firm—Fernandez & Associates, LLP

(57) ABSTRACT

A ternary state content addressable memory (CAM) cell that includes two DRAM cells. In addition to a port for controlling and transmitting data to the CAM, another port is exclusively used for refreshing the DRAM cells. A refresh word line is coupled to the two DRAM cells for performing DRAW cell refresh. A refresh bit line is coupled to the first of the two DRAM cells for refreshing this first DRAM cell. A refresh bit line is coupled to the second of the two DRAM cells for refreshing this second DRAM cell. Problematic power consumption and voltage swing found in a conventional CAM are overcome in the CAM. A swing line (SL) is coupled to said first and second DRAM cells and a local match line (LML) of said CAM cell, said SL having an adjustable voltage level for changing voltage swing in said LML to regulate trade-off between power consumption and speed of said CAM cell.

20 Claims, 4 Drawing Sheets

Truth table :

| Stored Value | Data A | Data B | Ndata | Data | Local Match Line | Result | |
|---|---|---|---|---|---|---|---|
| X | 0 | 0 | X | X | HIGH | Match | ~211 |
| 0 | 0 | 1 | 0 | 1 | LOW | Mis-match | ~212 |
| 0 | 0 | 1 | 1 | 0 | HIGH | Match | ~213 |
| 1 | 1 | 0 | 0 | 1 | HIGH | Match | ~214 |
| 1 | 1 | 0 | 1 | 0 | LOW | Mis-match | ~215 |
| 201 | 202 | 203 | 204 | 205 | 206 | 207 | |

DRAM BASED REFRESH-FREE TERNARY CAM

FIELD OF INVENTION

The invention relates to content addressable memory (CAM), and more particularly to CAM based on dynamic random access memory (DRAM).

BACKGROUND OF INVENTION

For implementing CAM, DRAM offers compelling advantages over static random access memory (SRAM). DRAM is smaller in size than SRAM. Thus, on a given area, DRAM offers inherently a denser memory than what SRAM can offer. As such, more information can be stored using DRAM. Also, because the more integration on a chip the better the performance, DRAM improves performance. Moreover, DRAM inherently consumes less power than SRAM, making DRAM well suited for high density CAM, wherein power consumption is a critical issue. Further still, DRAM requires fewer transistors per cell when compared to SRAM. Thus, DRAM lowers manufacturing cost. In summary, compared to SRAM, DRAM offers higher density, higher performance, lower power consumption, and lower manufacturing cost.

However, DRAM necessitates refresh overhead that slows the speed performance of CAM. This speed penalty defeats the purpose of using CAM, which is to provide high-speed memory access. In fact, CAM is required precisely in time critical applications. Nevertheless, because of the very nature of DRAM, refresh cannot be avoided. The voltage leakage of the capacitors in DRAM cells demands that refresh be performed to preserve stored data.

Thus an impasse has been reached, wherein on the one hand DRAM-based CAM offers many distinct advantages compelling benefits over SRAM-based CAM, and wherein on the other hand speed penalty of DRAM-based CAM defeats the purpose of using a CAM for time critical applications. In view of this impasse, a need exists for taking advantages of DRAM in implementing CAM while not paying the speed penalty caused by DRAM refresh.

SUMMARY OF INVENTION

The invention is a system and a method for a content addressable memory (CAM) based on dynamic random access memory (DRAM). The invention does not use static random access memory (SRAM) to implement CAM. Rather, the invention is drawn to a DRAM-based CAM that offers the advantages of DRAM (over SRAM) without the speed penalty associated with DRAM refresh. In the invention, a refresh mechanism at the system level of the CAM makes the refreshing process transparent to other processes of the CAM system. The invention devotes an entire port to refresh; this is the port additional to the port to typical data and control functions. In so doing, the invention answers the need to take advantage of DRAM in a CAM while preserving the high speed performance demanded of any CAM.

Preferably, a CAM system includes a ternary state CAM cell constituted by two DRAM cells. A set of wire lines are devoted for refreshing the DRAM cells. In particular, a refresh word line (RWL) is coupled to both DRAM cells. This RWL's function is to refresh the DRAM cells making up the CAM cell. Two refresh bit lines (RBL's) are also implemented for refreshing these two DRAM cells. One of the RBL is coupled to one of the DRAM cell, while the other RBL is coupled to the other DRAM cell. Advantageously, the invention offers the benefits of DRAM for the CAM system while not slowing the speed performance of the CAM system.

In addition to a refresh mechanism, a swing line (SL) is implemented to regulate voltage swing in a local match line (LML) of the CAM system. Specifically, the SL is coupled to the both DRAM cells and the LML. Moreover, voltage level of the SL can be adjusted. The SL has an adjustable voltage level for changing voltage swing in the LML to regulate trade-off between power consumption and speed of the CAM cell. Advantageously, the SL enables a user to regulate and fine-tune power consumption of the CAM system.

These and other objects and advantages of the present invention will no doubt become obvious to those of ordinary skill in the art after having read the following detailed description of the preferred embodiments which are illustrated in the various drawing figures.

BRIEF DESCRIPTION OF DRAWINGS

The accompanying drawings which are incorporated in and form a part of this specification, illustrate embodiments of the invention and together with the description, serve to explain the principles of the invention:

FIG. 2 provides a truth table summarizing the logical relationships among various signals in the CAM cell of FIG. 1.

DETAILED DESCRIPTION OF PREFERRED EMBODIMENT(S)

Reference is made in detail to the preferred embodiments of the invention, a ternary state dynamic random access memory (DRAM)-based content addressable memory (CAM). While the invention is described in conjunction with the preferred embodiments, the invention is not intended to be limited by these preferred embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, as is obvious to one ordinarily skilled in the art, the invention may be practiced without these specific details. In other instances, well-known methods, procedures, components, and circuits have not been described in detail so that aspects of the invention will not be obscured.

The invention is drawn to a system and a method for a ternary state CAM that is based on DRAM. Preferably, the invention does not use static random access memory (SRAM) exclusively to implement CAM. Rather, the invention offers in particular a DRAM-based CAM that offers the advantages of DRAM (over SRAM) while reconciling the weakness of the DRAM, i.e., the speed penalty of using DRAM that defeats the purpose of using a CAM. Specifically, the invention implements a refresh mechanism at the system level to make the refreshing process transparent to other processes of a CAM system. The invention devotes an entire port to refresh; this is the port additional to the port to typical data and control functions. In so doing, the invention answers the need to take advantage of DRAM in a CAM while preserving the high speed performance demanded of any CAM. Furthermore, a swing line (SL) is introduced. The SL has an adjustable voltage level for changing voltage swing in a local match line of the CAM cell to regulate trade-off between power consumption and speed of said CAM cell. Finally, advantageously, the invention can be realized with simple modifications in standard DRAM manufacturing process.

Figure 1:
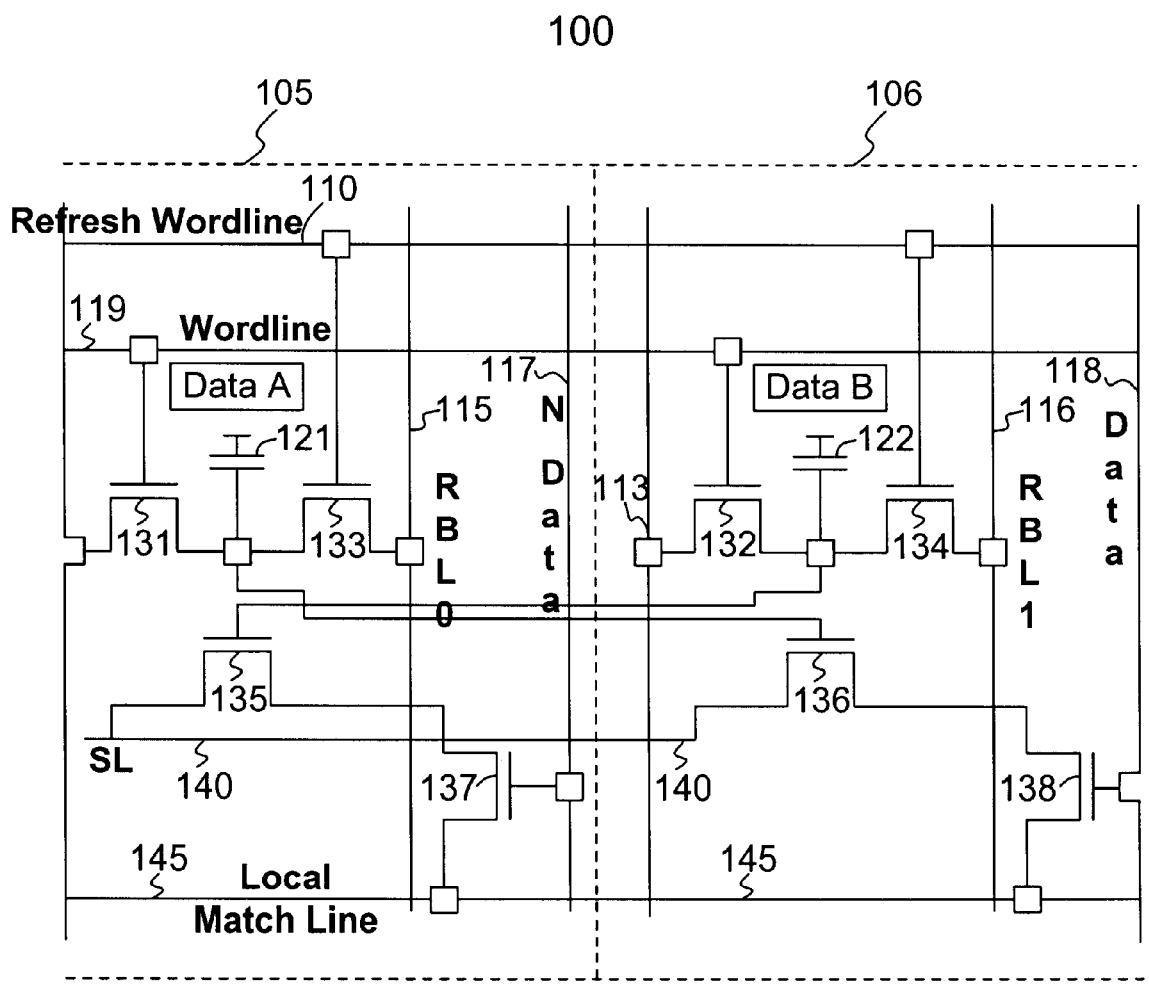
FIG. 1 depicts a content addressable memory (CAM) cell in accordance with one embodiment of the invention.

Referring now to FIG. 1, a CAM cell 100 is depicted according to one embodiment of the present invention. CAM cell 100 includes two DRAM cells 105–106, making CAM cell 100 a DRAM-based CAM cell. CAM cell 100 is used as a building unit for a DRAM-based CAM in accordance with the present embodiment.

CAM cell 100 offers ternary data storage. Preferably, these two DRAM cells (105–106) together can store up to four different states. Three of these four states ('0', '1', and 'X') are used in CAM cell 100, making CAM cell 100 into a ternary state CAM cell. Alternatively, more states can be stored by CAM cell 100 by, for example, adding more capacitors to DRAM cells 105–106.

Continuing with FIG. 1, each of DRAM cells 105–106 includes a capacitor to store data. DRAM cell 105 includes capacitor 121; DRAM cell 106 includes capacitor 122. In the present embodiment, each of capacitors 121–122 has 60 ff of capacitance (approximately 2.5× normal DRAM cell capacitance), thereby offering excellent immunity to noise. However, alternatively, other type of capacitor having a different capacitance can be used for the invention. DRAM cells 105–106 of CAM cell 100 necessitate refresh of capacitors 121–122. In view of the required refresh, a dual-port approach is implemented for transparent and continuous internal refresh of DRAM cells 105–106. Specifically, on the one hand, CAM cell 100 still includes elements typically found for accessing memory cells through a single port. On the other hand, CAM cell 100 also includes an additional port through which refresh can be performed. Moreover, this additional port can be used exclusively for refresh purpose.

Continuing still with FIG. 1, Word line (WL) 119 is coupled to both DRAM cells 105–106. Bit lines (BL's) 112–113 are coupled, respectively, to DRAM cells 105–106. WL 119 is the read/write word line used along with BL 112 and BL 113 to read/write from CAM cell 100. Specifically, pass gates 131–132 are adapted to control data access, respectively, to capacitors 121–122. Data access by WL 119 and BL 112 to capacitor 121 is regulated by pass gate 131, whereas data access by WL 119 and BL 113 to capacitor 122 is regulated by pass gate 132. A switched-on pass gate 131 provides a data access path from capacitor 121 to WL 119 and BL 112, whereas a switched-off pass gate 131 severs the data access path from capacitor 121 to WL 119 and BL 112. Similarly, a switched-on pass gate 132 provides a data access path from capacitor 122 to WL 119 and BL 113, whereas a switched-off pass gate 132 severs the data access path from capacitor 122 to WL 119 and BL 113.

Referring still to FIG. 1, refresh word line (RWL) 110 is coupled to both DRAM cells 105–106. Refresh bit lines (RBL's) 115–116 are coupled, respectively, to DRAM cells 105–106. RWL 110 is the word line used along with RBL's 115–116 to transparently and continuously refresh capacitors 121–122 such that no system level interrupts are needed for refresh. As such, a SRAM-like interface at the system level is provided by the present embodiment without the need for any cycle stealing or complicated memory controller to hide refresh overhead. Additionally, refresh pass gates 133–134 are adapted to control data refresh and data restore, respectively, to capacitors 121–122. Specifically, data refresh and data restore by RWL 110 and RBL 115 to capacitor 121 are regulated by pass gate 133, whereas data refresh and data restore by RWL 110 and RBL 116 to capacitor 122 are regulated by pass gate 134. A switched-on refresh pass gate 133 provides a data refresh/restore path from capacitor 121 to RWL 110 and RBL 115, whereas a switched-off refresh pass gate 133 severs this data refresh/restore path from capacitor 121 to RWL 110 and RBL 115. Similarly, a switched-on refresh pass gate 134 provides a data refresh/restore path from capacitor 122 to RWL 110 and RBL 116, whereas a switched-off refresh pass gate 134 severs this data refresh/restore path from capacitor 122 to RWL 110 and RBL 116.

Still referring to FIG. 1, a LML 145 is coupled to both DRAM cells 105–106 in order to transfer out data stored in CAM cell 100 for comparison to a data key. Two complement compare data lines, N data line 117 and Data line 118, carry information of the data key to be compared with the state stored by CAM cell 100. Specifically, pass gates 135 coupled to capacitor 121 and pass gate 137 (controlled by signal from an N Data line 117) form a XOR gate that controls the discharge of LML 145. Similarly, pass gate 136 coupled to capacitor 122 together with pass gate 138 (controlled by a Data line 118) form a XOR gate that controls the discharge of LML 145. A truth table summarizing these two XOR gates will be provided in FIG. 2.

Continuing with FIG. 1, additionally, a SL 140 is used to control voltage swing of LML 145 in order to provide power management. SL 140 limits and reduces the match line voltage swing to obtain optimum speed/power trade-off. Specifically, various voltage levels can be maintained by SL 140 to limit voltage swing of LML 145. In the present embodiment, the higher the voltage maintained on SL 140, the lower the voltage swing of LML 145 with less power consumption. The lower the voltage maintained on SL 140, the faster switching speed of LML 145 with more power consumption. As such, SL 140 offers to a user the flexibility in setting speed/power trade-off.

Referring now FIG. 2 in view of FIG. 1, a truth table 200 is shown summarizing the behavior of CAM cell 100 in relation to signal states maintained by various elements within CAM cell 100 in accordance with the present embodiment. First column 201 lists the ternary states that can be stored in CAM cell 100; these states include 'X', '0', and '1'. Second column 202 lists binary states of '0' and '1' that can be stored in capacitor 121 of DRAM cell 105; third column 203 lists binary states of '0' and '1' that can be stored in capacitor 122 of DRAM cell 106. Fourth column 204 lists the ternary states that can be maintained in one of the complement compare data lines, namely N data line 117. Fifth column 205 lists the ternary states that can be maintained in the other complement compare data line, namely Data line 118. Sixth column 206 lists 'high' and 'low' as the two available voltage levels for LML 145. Finally, seventh column 207 lists 'match' and 'mismatch' as the two possible results for comparing states of N data line 117 and Data line 118 with the states of CAM 100.

Referring still to FIG. 2 in view of FIG. 1, row 211 indicates that 'X' state of CAM cell is represented by '0' of DRAM cell 105 and '0' of DRAM cell 106. Also, row 211 lists 'X' state for Data line 118, resulting in 'high' voltage level of LML 145 to indicate a local match of the data key and the stored value of CAM cell 100.

Continuing with FIG. 2 in view of FIG. 1, rows 212–213 both indicate that '0' state of CAM cell 100 is represented by '0' of DRAM cell 105 and '1' of DRAM cell 106. In row 212, because state '1' of Data line 118 does not match state '0' of CAM cell 100, LML 145 is driven 'low' to indicate a partial mismatch of the data key and the stored value (state '0') of CAM cell 100. In row 213, because state '0' of Data line 118 matches state '0'of CAM cell 100, LML 145 is driven 'high to indicate a partial match of the data key and the stored value (state '0') of CAM cell 100.

Continuing still with FIG. 2 in view of FIG. 1, rows 214–215 both indicate that '1' state of CAM cell 100 is represented by '1' of DRAM cell 105 and '0' of DRAM cell 106. In row 214, because state '1' of Data line 118 matches state '1' of CAM cell 100, LML 145 is driven 'high to indicate a partial match of the data key and the stored value (state '1') of CAM cell 100. In row 215, because state '0' of Data line 118 does not match state '1' of CAM cell 100, LML 145 is driven 'low' to indicate a partial mismatch of the data key and the stored value (state '1') of CAM cell 100.

Figure 3A:
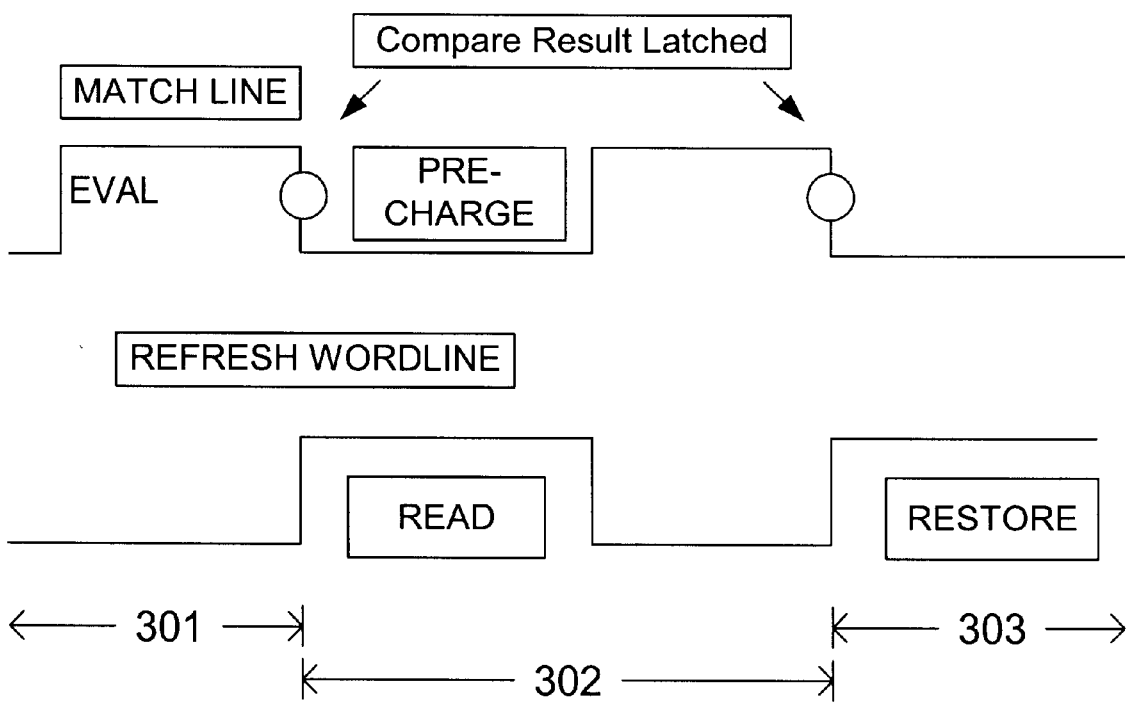
FIG. 3A is a timing diagram for the CAM cell of FIG. 1.

Referring now to FIG. 3A in view of FIG. 1, a timing diagram for both LML 145 and RWL 110 is shown in accordance with one embodiment of the invention. As shown, LML 145 is pre-charged at the end of the compare cycle 301. This pre-charge keeps LML 145 ready for the following cycle 302. After the compare operation, the result of LML 145 is latched in cycle 302. Also effectively in cycle 302, RWL 110 is turned ON, wherein the data stored in capacitors 121–122 are read, respectively, into a sense amplifier (not shown) through RBL's 115–116. In cycle 302, data A (from capacitor 121) and data B (from capacitor 122) are held in the sense amplifier and respectively in RBL's 115–116, and the next compare operation is carried ON. After the compare, effectively in cycle 303, data A and data B from the previous read access are restored, respectively, back into capacitors 121–122 effectively at the time of pre-charging LML 145.

Referring still to FIG. 3 in view of FIG. 1, because refresh/restore operation can disturb CAM cell 100 and cause a false mis-match, the LML result is latched while the refresh/restore operation occurs. Moreover, LML 145 is in the pre-charge phase while the refresh/restore operation occurs. Advantageously, in so doing, the invention avoids disturbing CAM cell 100 and causing a false mis-match.

Also, as shown in FIG. 3A in view of FIG. 1, refresh operation can be pipe-lined. Between the read and restore, data A and data B are held in the sense amplifier and RBL's 115–116. After the next compare cycle, data A and data B that are ready on RBL's 115–116 are immediately written into capacitors 121–122 for the entire cycle. In so doing, the invention enables a pipe-lined refresh/restore operation to be performed.

Continuing with FIG. 3 in view of FIG. 1, the refresh/ restore operation can be implemented in multiple stages in order to avoid speed penalty. Specifically, because restoring data can sometime take longer to complete (in the case of restoring a '1'), combining restore with refresh slows down performance of the CAM. Fortunately, data restore can be completed for approximately 75% of voltage level, which is sufficient for sensing a mis-match on the next clock cycle. Thus, as shown in FIG. 3, the cycle time can be "squeezed" to perform a sufficient refresh effectively during the pre- charge time of the LML 145 in the firs cycle of the pipe-lined refresh. In other words, the read cycle (cycle 302) completes a 'sufficient' refresh, whereas the restore cycle (cycle 303) brings voltage level of a '1' from 75% to 100%.

Figure 3B:
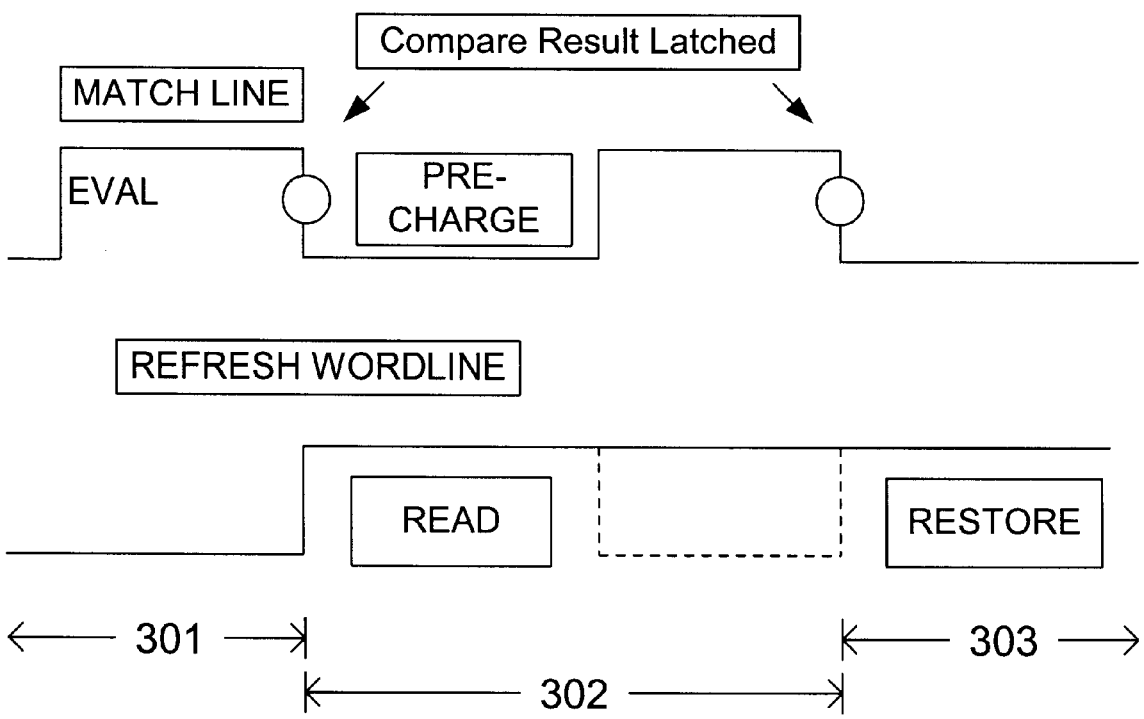
FIG. 3B is an alternative timing diagram for the CAM cell of FIG. 1.

Referring now to FIG. 3B in view of FIG. 1, an alternative timing diagram for both LML 145 and RWL 110 is shown in accordance with another embodiment of the invention. As shown, effectively in cycle 302, RWL 110 is turned ON to read data A and data B into the sense amplifier through RBL's 115–116. However, RWL 110 need not be driven low during the second half of cycle 302. As shown, RWL 110 remains high effectively in cycle 302. That is, after the "sufficient' refresh, RWL 110 can remain On during the compare cycle.

In an alternative embodiment of the invention, 2K rows of CAM cells are refreshed every 8 ms. Internal refresh logic includes a counter that is adapted to select every row incrementally. Every two clock cycles, one row is refreshed. However, this particular refresh rate can be changed to strike the right trade-off between power and refresh capability of the CAM in accordance with the invention.

The foregoing descriptions of specific embodiments of the invention have been presented for purposes of illustration and description. They are not intended to be exhaustive or to limit the invention to the precise forms disclosed. Obviously, many modifications and variations are possible in light of the above teaching. The embodiments were chosen and described in order to explain the principles and the appli- cation of the invention, thereby enabling others skilled in the art to utilize the invention in its various embodiments and modifications according to the particular purpose contem- plated. The scope of the invention is intended to be defined by the claims appended hereto and their equivalents.

What is claimed is:

1. A content addressable memory (CAM) cell, said CAM cell comprising:
    a first DRAM cell and a second DRAM cell, said first and second DRAM cells adapted to provide a ternary state option for said CAM cell;
    a refresh word line (RWL) coupled to said first DRAM cell and said second DRAM cell, said RWL adapted to refresh said first and second DRAM cells;
    a first refresh bit line (RBL) coupled to said first DRAM cell, said first RBL adapted to refresh said first DRAM cell; and
    a second RBL coupled to said second DRAM cell, said second RBL adapted to refresh said second DRAM cell, wherein said RWL, said first RBL, and said second RBL accessible through a port adapted for refreshing said ternary state CAM cell.

2. The CAM cell of claim 1, wherein said RWL is exclusively adapted to refresh said first and said second DRAM cells, wherein said first RBL is exclusively adapted to refresh said first DRAM cell, and wherein said second RBL is exclusively adapted to refresh said second DRAM cell.

3. The CAM cell of claim 1 further comprising:
    a swing line (SL) coupled to said first and second DRAM cells and a local match ine (LML) of said CAM cell, said SL having an adjustable voltage level for changing voltage swing in said LML to regulate trade-off between power consumption and speed of said CAM cell.

4. The CAM cell of claim 1, wherein said first DRAM cell has cell capacitance approximately 2.5× normal DRAM cell capacitance, thereby improving said first DRAM cells immunity to noise, and wherein said second DRAM cell has cell capacitance approximately 2.5× normal DRAM cell capacitance, thereby improving said second DRAM cell's immunity to noise.

5. The CAM cell of claim 1, wherein said RWL, said first RBL, and said second RBL are adapted for pipe-lined refresh by performing refresh operation in one or more stages.

6. The CAM cell of claim 1 further including a counter that is adapted to select said CAM cell for refresh at a adjustable refresh rate.

7. A CAM system having a plurality of rows of CAM cells, said CAM system comprising:

a ternary state CAM cell comprising a first DRAM cell and a second DRAM cell;

a RWL coupled to said first DRAM cell and said second DRAM cell, said RWL adapted to refresh said first and second DRAM cells;

a first RBL coupled to said first DRAM cell, said first RBL adapted to refresh said first DRAM cell; and a second RBL coupled to said second DRAM cell, said second RBL adapted to refresh said second DRAM cell, wherein said RWL, said first RBL, and said second RBL accessible through a port adapted for refreshing said ternary state CAM cell.

8. The CAM system of claim 7 further comprising a counter that is adapted to select incrementally every row of said plurality of rows of CAM cells for refresh at a adjustable refresh rate.

9. The CAM system of claim 7, wherein said RWL is exclusively adapted to refresh said first and said second DRAM cells, wherein said first RBL is exclusively adapted to refresh said first DRAM cell, and wherein said second RBL is exclusively adapted to refresh said second DRAM cell.

10. The CAM system of claim 7 further comprising:

a SL coupled to said first and second DRAM cells and a LML of said CAM cell, said SL having an adjustable voltage level for changing voltage swing in said LML to regulate trade-off between power consumption and speed of said CAM cell.

11. The CAM system of claim 7, wherein said first DRAM cell has cell capacitance approximately 2.5× normal DRAM cell capacitance, thereby improving said first DRAM cell's immunity to noise, and wherein said second DRAM cell has cell capacitance approximately 2.5× normal DRAM cell capacitance, thereby improving said second DRAM cell's immunity to noise.

12. The CAM system of claim 7, wherein said RWL, said first RBL, and said second RBL are adapted for pipe-lined refresh by performing refresh operation in one or more stages.

13. The CAM system of claim 7 further including a counter that is adapted to select said CAM cell for refresh at a adjustable refresh rate.

14. A method for CAM operation, said method comprising the steps of:

a) via a first port, accessing data using a ternary state CAM cell having a first DRAM cell and a second DRAM cell; and b) via a second port, refreshing said ternary state CAM cell.

15. The method of CAM operation of claim 14, comprising the steps of:

c) matching said data with a data key; and d) asserting a local match line responsive to a match of said data with said data key.

16. The method of CAM operation of claim 14, wherein said step b) is performed at an adjustable rate and regulated by a counter that is adapted to select said CAM cell for refresh at a adjustable refresh rate.

17. The method of CAM operation of claim 14, wherein in said step b) a RWL is exclusively adapted to refresh said first and said second DRAM cells, wherein in said step b) a first RBL is exclusively adapted to refresh said first DRAM cell, and wherein in said step b) a second RBL is exclusively adapted to refresh said second DRAM cell.

18. The method of CAM operation of claim 17, wherein said RWL, said first RBL, and said second RBL are adapted for pipe-lined refresh by performing refresh operation in one or more stages.

19. The method of CAM operation of claim 15, wherein said step d) further comprising the step of:

adjusting voltage level of a SL to regulate voltage swing in said LML, said SL coupled to said first and second DRAM cells and a LML of said CAM cell, said SL having an adjustable voltage level for changing voltage swing in said LML to regulate trade-off between power consumption and speed of said CAM cell.

20. The method of CAM operation of claim 14, wherein said first DRAM cell has cell capacitance approximately 2.5× normal DRAM cell capacitance, thereby improving said first DRAM cell's immunity to noise, and wherein said second DRAM cell has cell capacitance approximately 2.5× normal DRAM cell capacitance, thereby improving said second DRAM cell's immunity to noise.

* * * * *